(12) United States Patent
Liu et al.

(10) Patent No.: US 7,789,546 B2
(45) Date of Patent: Sep. 7, 2010

(54) LIGHT-EMITTING DEVICE AND ELECTRONIC DEVICE USING THE SAME

(75) Inventors: Yu-Nan Liu, Kaohsiung (TW); Ching-Ching Chen, Kaohsiung (TW)

(73) Assignee: Lite-On Technology Corporation, Taipei (TW)

( * ) Notice: Subject to any disclaimer, the term of this patent is extended or adjusted under 35 U.S.C. 154(b) by 215 days.

(21) Appl. No.: 12/071,422

(22) Filed: Feb. 21, 2008

(65) Prior Publication Data
US 2008/0225508 A1    Sep. 18, 2008

(30) Foreign Application Priority Data
Mar. 13, 2007   (TW) .............................. 96108621 A

(51) Int. Cl.
*F21V 5/02*    (2006.01)
(52) U.S. Cl. ....................................... 362/555; 362/613
(58) Field of Classification Search ................. 362/555, 362/613
See application file for complete search history.

(56) References Cited

U.S. PATENT DOCUMENTS

| 7,651,231 B2 * | 1/2010 | Chou et al. .................... 362/85 |
| 2006/0007704 A1 * | 1/2006 | Mori et al. ................... 362/613 |
| 2009/0073724 A1 * | 3/2009 | Hayama et al. ............. 362/620 |
| 2009/0256726 A1 * | 10/2009 | Tsai ............................ 341/22 |

FOREIGN PATENT DOCUMENTS

TW    M296384    8/2006

\* cited by examiner

*Primary Examiner*—David V Bruce
(74) *Attorney, Agent, or Firm*—Bacon & Thomas, PLLC

(57) ABSTRACT

A light-emitting device and an electronic device using the same are provided. The light-emitting device includes a light-guiding plate, a circuit board, at least one light source unit and a reflective layer. The circuit board is disposed under the light-guiding plate. The reflective layer is disposed above the light-guiding plate. The light-guiding plate has at least one hole. The light source unit is disposed on the circuit board and within the hole. The reflective layer is disposed above the hole. The light-emitting device is disposed on one side of a part, such as a keypad, of the electronic device for providing light to the keypad.

10 Claims, 3 Drawing Sheets

LIGHT-EMITTING DEVICE AND ELECTRONIC DEVICE USING THE SAME

This application claims the benefit of Taiwan application Serial No. 96108621, filed Mar. 13, 2007, the subject matter of which is incorporated herein by reference.

BACKGROUND OF THE INVENTION

1. Field of the Invention

The invention relates in general to a light-emitting device and an electronic device using the same, and more particularly to a light-emitting device with multi-faceted light guiding effect and an electronic device using the same.

2. Description of the Related Art

For enabling users to operate electronic devices, such as mobile phone, PDA, or digital camera, in a dark environment or at nighttime, the electronic devices are normally equipped with light emitting elements. Light emitting diode (LED) or organic light emitting diode (OLED), having the advantages of small size, no radiation, low power consumption and fast response, has been widely used in the illumination of many electronic devices.

Take LED as an example of light emitting source for the keypad of a mobile phone. Normally, a number of LEDs are disposed on the circuit board of the mobile phone. The LEDs are disposed under the keypad of the mobile phone, and a light-guiding plate is disposed between the LEDs and the keypad. The light emitted from the LEDs is projected onto the keypad through the light-guiding plate. As each LED has specific lighting range and emission intensity, in order to assure that each press key on the keypad has sufficient illumination, several LEDs are used to meet the requirement. It requires not only more manufacturing cost but also consumes more power. Moreover, the LEDs and the light-guiding plate both have certain thickness. When the LEDs and the light-guiding plate are disposed between the circuit board and the keypad of the mobile phone, the overall thickness of the mobile phone will be increased.

SUMMARY OF THE INVENTION

The invention is directed to a light-emitting device and an electronic device using the same. The light-guiding plate of the light-emitting device has many holes. The light sources of the light-emitting device are disposed within the holes. The side-wall inside the hole of the light-guiding plate has special structure, and a reflective layer is disposed upon the hole. Therefore, when the light sources emit lights, the lights do not come out of the holes directly but are guided to the light-guiding plate through the reflective plate and then come out of the light-guiding plate at many different locations and along different directions.

According to a first aspect of the present invention, a light-emitting device including a light-guiding plate, a circuit board, at least one light source unit and a reflective layer is provided. The light-guiding plate has at least one hole. The circuit board is disposed under the light-guiding plate. The light source unit disposed on the circuit board is within the hole. The reflective layer is disposed on the light-guiding plate and above the hole.

According to a second aspect of the present invention, an electronic device including a keypad and a light-emitting device is provided. The light-emitting device includes a light-guiding plate, a circuit board, at least one light source unit and a reflective layer. The light-guiding plate disposed on one side of the keypad includes at least one hole. The circuit board is disposed under the light-guiding plate. The light source unit is disposed on the circuit board and within the hole. The reflective layer is disposed on the light-guiding plate and above the hole. The reflective layer is positioned between the keypad and the light-guiding plate.

The invention will become apparent from the following detailed description of the preferred but non-limiting embodiments. The following description is made with reference to the accompanying drawings.

DETAILED DESCRIPTION OF THE INVENTION

Figure 1A:
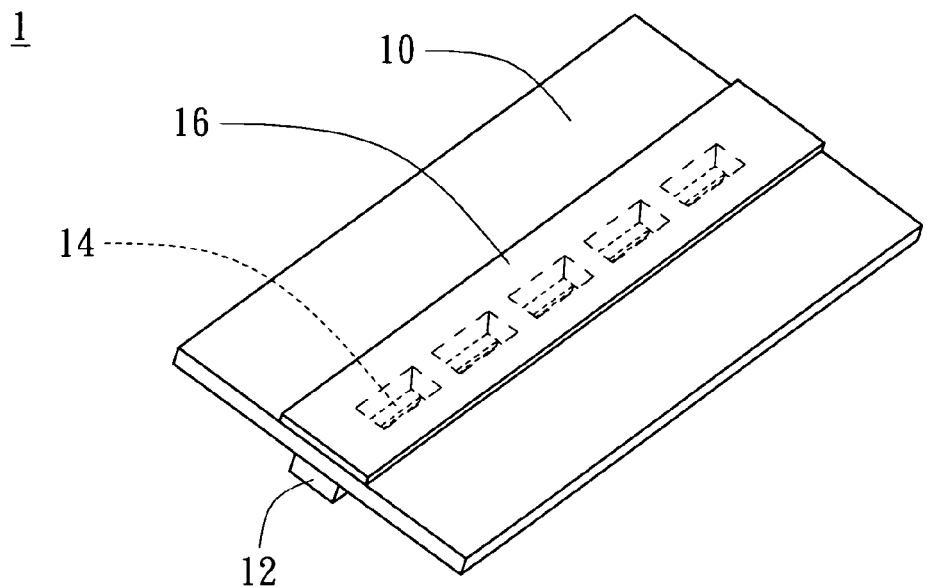
FIG. 1A is a 3-D perspective of a light-emitting device according to a preferred embodiment of the invention
Figure 1B:
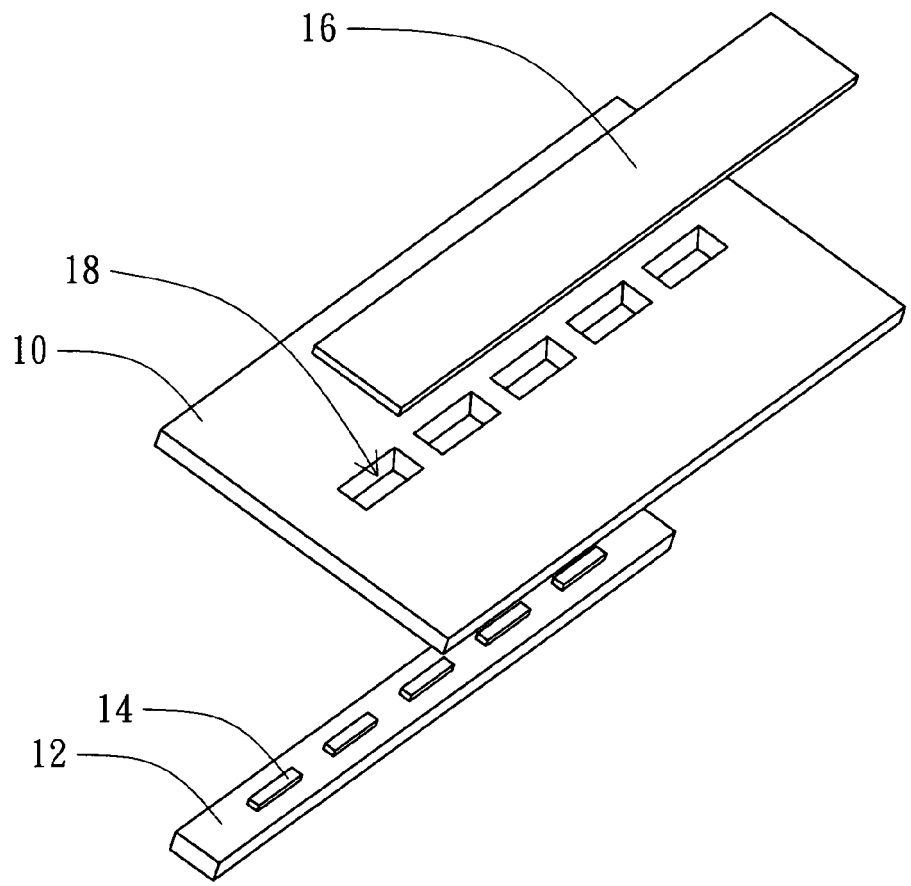
FIG. 1B is an exploded diagram of the light-emitting device of FIG. 1A.

Please refer to FIG. 1A~1B. FIG. 1A is a 3-D perspective of a light-emitting device according to a preferred embodiment of the invention. FIG. 1B is an exploded diagram of the light-emitting device of FIG. 1A. As indicated in FIGS. 1A~1B, the light-emitting device 1 includes a light-guiding plate 10, a circuit board 12, at least one light source unit 14, and a reflective layer 16. The light-guiding plate 10 includes at least one hole 18. The circuit board 12 is disposed under the light-guiding plate 10. The reflective layer 16 is disposed above the light-guiding plate 10. The light source unit 14 disposed on the circuit board 12 is within the hole 18. The reflective layer 16 is disposed above the hole 18. When the light source unit 14 is driven to emit a light, the light enters the light-guiding plate 10 via the reflective layer 16 and then is diffused by the light-guiding plate 10.

As indicated in FIG. 1B, in the present embodiment of the invention, the light-guiding plate 10 includes a number of holes 18, and a number of light source units 14 are disposed on the circuit board 12. The light source unit 14 having at least one light emitting diode (LED) package or one LED chip is disposed on and is electrically connected to the circuit board 12. The LED package or LED chip of light source unit 14 is driven to emit a light by the circuit board 12. Preferably, one hole 18 has one light source unit 14 disposed therein, that is, the number of the light source units 14 is the same as that of the holes 18.

Figure 2A:
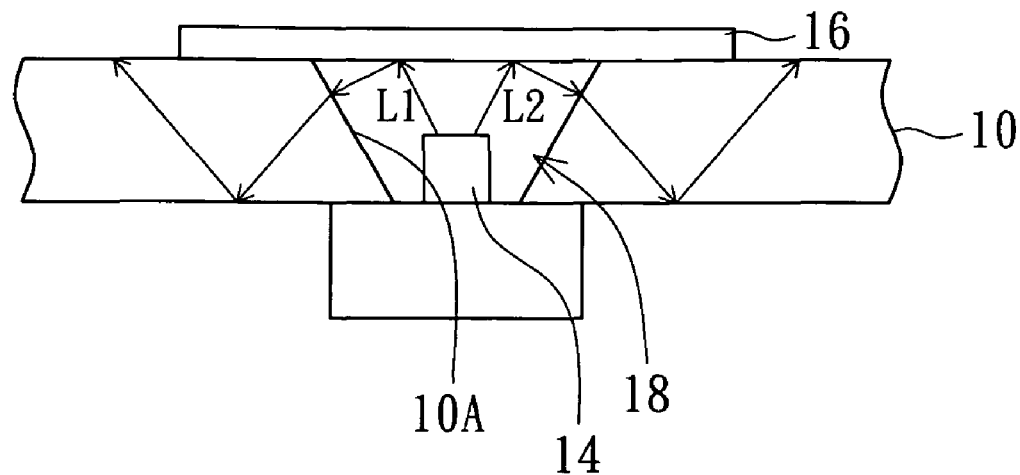
FIG. 2A is a cross-sectional view of the light-guiding plate with beveled side-wall according to the light-emitting device of FIG. 1A.

The shape of a hole 18 positioned on the light-guiding plate 10 is illustrated in FIG. 2A, a cross-sectional view of the light-guiding plate with beveled side-wall according to the light-emitting device of FIG. 1A. The light source unit 14 enters the light-guiding plate 10 via at least one side-wall 10A inside the hole 18. Therefore, the hole 18 is designed according to the optical path and direction of the light emitted from the light source unit 14. Preferably, the side-wall 10A connected to the top surface and the bottom surface of the light-guiding plate 10 is not perpendicular to the top surface or the bottom surface of the light-guiding plate 10 but forms a bevel or a curved surface. The hole 18 can be rectangular, circular or elliptical shape. Referring to FIG. 1B, in the present embodiment of the invention, the holes 18 positioned on the light-guiding plate 10 are rectangular shape. As indicated in FIG. 2A, the side-wall 10A inside the hole 18 of the light-guiding plate 10 is a bevel. When the light source unit 14 emits a light, the light cannot be projected out of the hole 18 directly because the reflective layer 16 is disposed above the hole 18. Meanwhile, the light (the light L1 and the light L2 of FIG. 2A) is reflected by the reflective layer 16 to enter the light-guiding plate 10 through the side-wall 10A of the hole 18 and is diffused by the light-guiding plate 10. With the angle between the bevel of the light-guiding plate 10 and the top surface and the angle between the bevel of the light-guiding plate 10 and the bottom surface, the incident angle of the light can be adjusted. The bevel of FIG. 2A can be replaced by a curved surface.

Figure 2B:
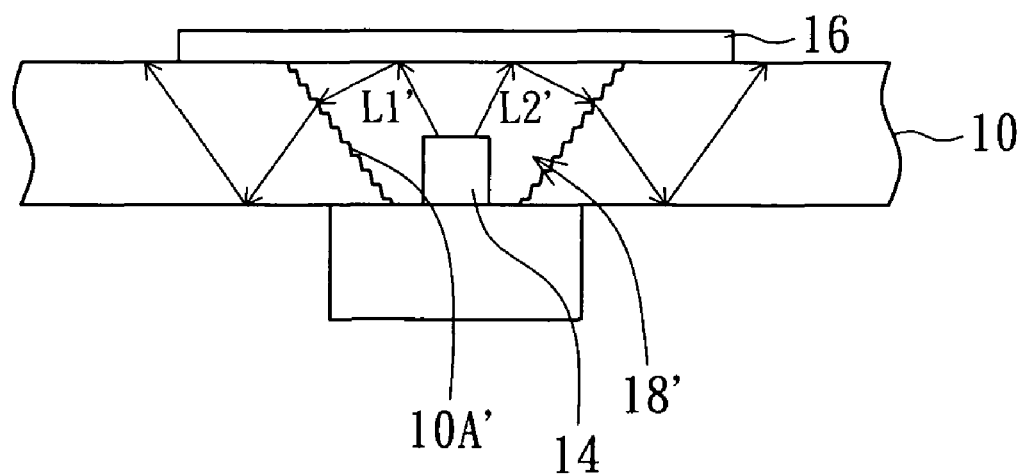
FIG. 2B is a cross-sectional view of the light-guiding plate with V-cut side-wall according to the light-emitting device of FIG. 1A.

The other design of the hole is illustrated in FIG. 2B, a cross-sectional view of the light-guiding plate with V-cut side-wall according to the light-emitting device of FIG. 1A. As indicated in FIG. 2B, the side-wall 10A' inside the hole 18' positioned on the light-guiding plate 10 has many connected V-cut grooves. When the light source unit 14 emits a light, the light, such as the light L1' and the light L2' of FIG. 2B, is reflected to the V-cut grooves via the reflective layer 16. Because the V-cut grooves each have two incident surfaces, the adjustment of the incident angle of the light is more flexible.

The light source unit 14 includes an LED chip or an LED package, and the intensity of illumination in the direction nearly perpendicular to the top surface or the bottom surface of the light-guiding plate 10 is the largest. When the LED chip or the LED package emits a light, the light is directly projected out of the hole 18 or 18' and the lighting range cannot be enlarged. By disposing a reflective layer 16 above the hole 18 or 18', the light emitted from the light source unit 14 is guided to the light-guiding plate 10 through the side-wall 10A or 10A', such that the lighting range is enlarged by the reflective layer 16, and the light is diffused in the light-guiding plate 10 uniformly.

In the light-emitting device 1 of the present embodiment of the invention, one hole 18 has one light source unit 14 disposed therein. In practical application, one hole 18 can have more than one light source unit disposed therein. Any designs having an opening on the light-guiding plate 10 and embedded with one or more than one light source units into the opening are within the scope of the invention. Despite in the present embodiment of the invention, the light source unit 14 of the light-emitting device 1 is exemplified by an LED chip or an LED package, the technology of the invention is not limited thereto. The light source unit 14 can be other LED devices, such as organic electro-luminescence device (OELD) or organic light emitting diode (OLED).

Figure 3:
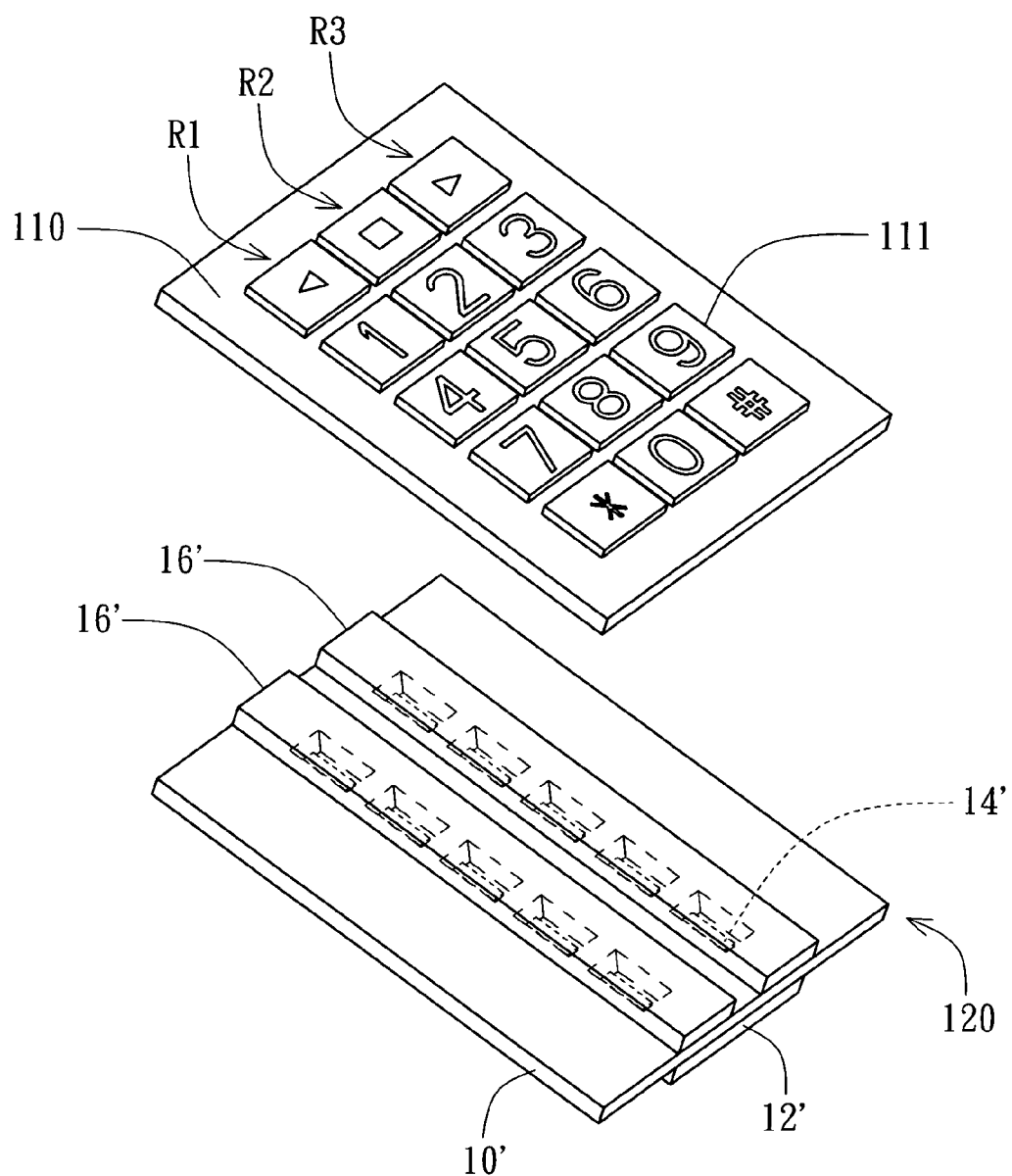
FIG. 3 is a partial exploded diagram of an electronic device according to a preferred embodiment of the invention.

The light-emitting device 1 can be used for illuminating the keypad of an electronic device. Referring to FIG. 3, a partial exploded diagram of an electronic device according to a preferred embodiment of the invention is shown. As indicated in FIG. 3, the electronic device 100 includes a keypad 110 and a light-emitting assembly 120, wherein the light-emitting assembly 120 is disposed on one side of the keypad 110. The keypad 110 includes several press keys 111 arranged in three columns for example. The numbers, symbols or letters on the press keys 111 (only numbers and symbols are illustrated in the present embodiment of the invention) are transparent or semi-transparent such that the keypad 110 can be illuminated even in a dark environment or at nighttime. The light-emitting assembly 120 includes the light-emitting device 1 disclosed in FIG. 1A. Preferably, to cooperate with the disposition of the press key 111 of FIG. 3, the light-emitting assembly 120 includes a light-guiding plate 10', a circuit board 12', two reflective layers 16' and a number of light source units 14' arranged in two columns. The reflective layer 16' and the light source unit 14' are disposed in correspondence to the gap between the first column R1 and the second column R1 of the keypad 110 and the gap between the second column R2 and the third column R3. When all the light source units 14' are driven to emit lights by the circuit board 12', the lights are reflected by the reflective layer 16' and enters the light-guiding plate 10', such that the lights are uniformly diffused to the press key 111.

Despite the present embodiment of the invention is exemplified by the arrangement that the light-emitting assembly 120 of the-electronic device 100 includes two reflective layers 16' and a number of light source units 14 arranged in two columns and correspondingly disposed between the columns of the keypad 110, the technology of the invention is not limited thereto. In practical application, the position and the shape of the hole positioned on the light-guiding plate 10' of the electronic device 100 are designed according to actual needs, such that the light emitted from the light source unit 14' is uniformly diffused to the keypad 110 through the light-guiding plate 10'.

According to conventional light guiding method, the LED light source is disposed under the light-guiding plate. In the present embodiment of the invention, the light-guiding plate 10 of the light-emitting device 1 (refer to FIG. 1B) has several holes 18, and the shapes of the holes 18 are not limited to any particular shape. With a bevel or a V-cut groove on the side-wall 10A of the holes 18, the out-going angle and the direction of the light are adjusted such that the light has the effect of multi-faceted diffusion. Besides, the light source unit 14 is disposed within the hole 18 of the light-guiding plate 10, such that the thickness of the device is reduced. Moreover, as the reflective layer 16 is disposed above the hole 18 and the light source unit 14 is directly embedded into the light-guiding plate 10, the light of the light source unit 14 is reflected by the reflective layer 16 and enters the light-guiding plate 10 directly. As a result, the light-emitting device of the present embodiment of the invention has lower optical loss but higher optical availability.

According to the light-emitting device and an electronic device using the same disclosed in the above embodiment of the invention, a hole with specific shape is positioned on the light-guiding plate, and a light source unit disposed on the circuit board is embedded within the hole, such that the emitting direction of the light from the light source unit is changed through the hole. As a result, the out-going direction and position of the light are adjusted and multi-faceted diffusion effect is shown. The light-emitting device has simple structure and is easy to assemble. It is indeed an economic and practical way to dispose the light-emitting device in the electronic device for providing light to the keypad such that the keypad has uniform illumination.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, comprising:
   a keypad; and
   a light-emitting device, comprising:

a light-guiding plate disposed on one side of the keypad, wherein the light-guiding plate comprises at least one hole;

a circuit board disposed under the light-guiding plate;

at least one light source unit disposed on the circuit board and within the hole; and a reflective layer disposed above the hole and between the keypad and the light-guiding plate.

2. The electronic device according to claim 1, wherein when the light source unit is driven to emit a light, the light emitted from the light source unit is reflected by the reflective layer to enter the light-guiding plate and is diffused by the light-guiding plate.

3. The electronic device according to claim 1, wherein the light-guiding plate has at least one side wall positioned inside the hole of the circuit board, the light-guiding plate has a top surface and a bottom surface, the side-wall connects the top surface and the bottom surface, the light emitted from the light source unit enters the light-guiding plate via the side-wall.

4. The electronic device according to claim 3, wherein the side-wall inside the hole is substantially not perpendicular to the top surface or the bottom surface.

5. The electronic device according to claim 3, wherein the side-wall inside the hole comprises a bevel.

6. The electronic device according to claim 3, wherein the side-wall inside the hole comprises a curved surface.

7. The electronic device according to claim 3, wherein the side-wall inside the hole has a plurality of connected V-cut grooves.

8. The electronic device according to claim 1, wherein the light-guiding plate comprises a plurality of holes, a plurality of light source units having the same number with the holes are disposed on the circuit board, the light source units are respectively disposed within the holes.

9. The electronic device according to claim 1, wherein the light source unit comprises at least one LED package.

10. The electronic device according to claim 1, wherein the light source unit comprises at least one LED chip.

* * * * *